Dec. 15, 1970 F. J. BOURASSA ET AL 3,548,268

HIGH-POWER SEMICONDUCTOR DEVICES

Filed Oct. 22, 1968 3 Sheets-Sheet 1

INVENTORS
FRANCIS J. BOURASSA
PAUL GREIFF
BY Joseph Weingarten
Stanley M. Schurgin
ATTORNEYS INVENTORS
FRANCIS J. BOURASSA
PAUL GREIFF
BY Joseph Weingarten
Stanley M. Schurgin
ATTORNEYS

HIGH-POWER SEMICONDUCTOR DEVICES

INVENTORS
FRANCIS J. BOURASSA
PAUL GREIFF
BY Joseph Weingarten
Stanley M. Schurgin
ATTORNEYS United States Patent Office 3,548,268

Patented Dec. 15, 1970

3,548,268
HIGH-POWER SEMICONDUCTOR DEVICES

Francis J. Bourassa, Chestnut Hill, and Paul Greiff, Wayland, Mass., assignors to Unitrode Corporation, Watertown, Mass., a corporation of Maryland Filed Oct. 22, 1968, Ser. No. 769,516
Int. Cl. H01l *1/14*
U.S. Cl. 317—234 13 Claims

ABSTRACT OF THE DISCLOSURE

A semiconductor device especially suited for high power applications in which a semiconductor die having at least one planar junction is intimately bonded to an axial stud terminal structure and glass sleeves fused to the stud terminals and to the die to form a rugged unitary device having extremely efficient electrical and thermal properties.

FIELD OF THE INVENTION

This invention relates to semiconductor devices and more particularly to three and four terminal semiconductor devices especially suited to high-power operation.

BACKGROUND OF THE INVENTION

Semiconductor devices are limited in their power handling capacity primarily by their ability to dissipate heat generated within the semiconductor body during operation. Thus, semiconductor devices, especially those used for high-power applications, are generally packaged in a manner to dissipate the heat to the environment in which the device is to operate. In the case of thyristors, the power handling capacity of such devices is further limited by the ability of the gate electrode to carry high currents. Thyristors of conventional design generally cannot tolerate high currents through the gate electrode by reason of a relatively small junction area, and the rather inefficient thermal dissipation properties of the device. This power limitation is especially deleterious since thyristors are often employed in switching circuits where transients can cause the flow of excessive gate currents, with the consequent danger of damage or even destruction of the device. As a result, larger devices must be employed for a given power rating to provide reliable performance, which, but for thermal considerations, could be accomplished with smaller devices. It is, therefore, an object of this invention to provide a semiconductor device which has extremely efficient electrical and thermal characteristics as well as a rugged mechanical configuration.

SUMMARY OF THE INVENTION

In brief, the invention comprises a semiconductor device having at least one planar junction intimately bonded to an axially configured terminal structure which provides extremely effective thermal dissipation. The semiconductor itself comprises a generally cylindrical die of semiconductor material having one or more PN junctions formed therein, with a planar junction diffused in one surface of the die well-known planar diffusion and masking techniques to form a PN junction of closed configuration which terminates at the surface of the die into which the junction is diffused. The edge of the planar junction terminating at the surface lies beneath a closed pattern of oxide, which acts as a passivation layer to protect the junction from contamination. An axial stud terminal structure is, according to the invention, intimately bonded to the junction region of the semiconductor body to provide an effective electrical and thermal packaging configuration.

In a three terminal device, an electrically and thermally conductive cylindrical stud terminal of substantially the diameter of the die is fused to the face of the die opposite the planar junction, and an electrically and thermally conductive collar, having an outside diameter of substantially the same diameter as the cylindrical terminal, is fused to the surface containing the planar junction to the region outside the periphery of the oxide pattern. A second cylindrical stud terminal, dimensioned and configured to be substantially co-extensive with the area within the oxide pattern is fused to this region and is disposed coaxially within the collar terminal. An electrical insulative and thermally conductive glass or other suitable material is fused in the annular space between the coaxial terminals, intimately bonding the confronting surfaces of these terminals and the associated surfaces of the semiconductor. It is a particular feature of the invention that the oxide pattern prevents junction contamination which may occur when the glass is sealed between the terminals. A sleeve of electrically insulative and thermally conductive glass or other material is formed around the colinear terminals and the intermediate semiconductor body to intimately bond the surfaces to provide a unitary rugged package.

As embodied in a four terminal device, a planar junction is formed in each flat surface of a semiconductor die with an oxide annulus or other closed pattern formed over the edge of each planar junction to provide passivation. A pair of electrically and thermally conductive cylindrical stud terminals, each of substantially the area of respective regions within the oxide annuli, and a pair of collar terminals dimensioned to accommodate to the respective areas outside of the oxide annuli are fused to these outer areas. Thus, two coaxial terminals are provided on opposite faces of the die, the terminals being bonded to the die and to each other by glass or other suitable material, as described hereinabove.

Electrical connection can be made to the device by electrically and thermally conductive leads attached to respective collar and stud terminals. Typically, an elongated cylindrical lead is attached to each cylindrical stud terminal and extends coaxially therewith, and a flat tab-like lead is fitted around one end of each collar terminal and secured thereto to provide a radially extending lead.

The invention is useful in constructing many three and four terminal semiconductor devices, and is particularly useful for those devices which operate at high-power levels, such as thyristors. Devices according to the invention can handle substantially higher power than devices of conventional design of commensurate size by reason of the highly effective thermal and electrical configuration provided.

DESCRIPTION OF THE DRAWINGS

The invention will be more fully understood from the following detailed description, taken in conjunction with the accompanying drawings, in which.

DETAILED DESCRIPTION OF THE INVENTION

Figure 1:
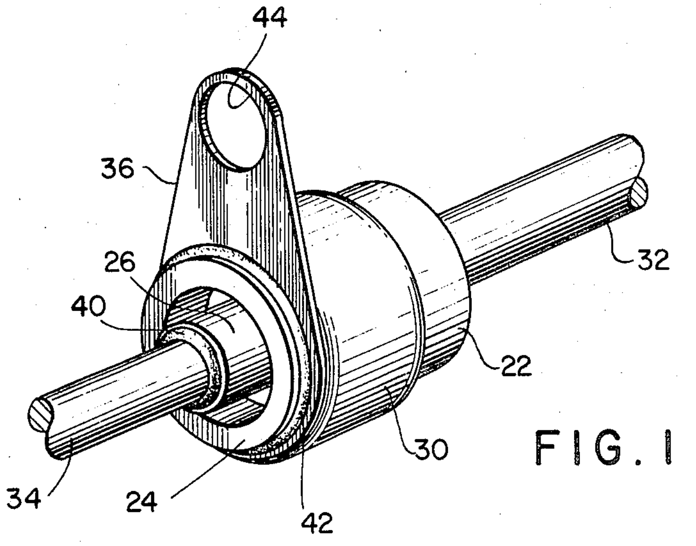
FIG. 1 is a pictorial view of a semiconductor device embodying the present invention.
Figure 2:
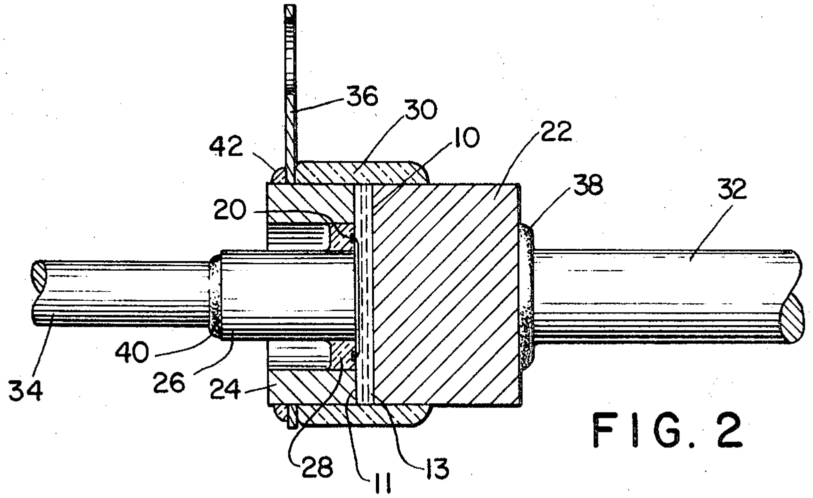
FIG. 2 is a sectional elevation view of the device of FIG. 1.
Figures 3, 9:
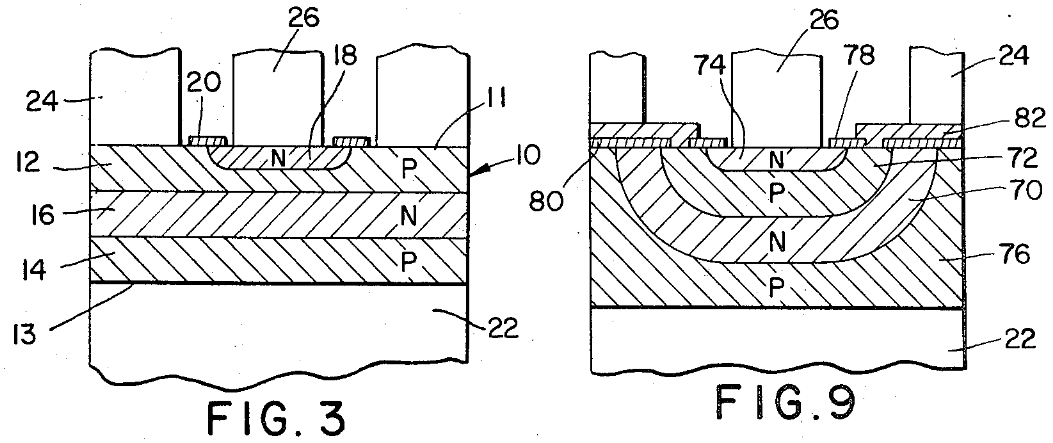
FIGS. 3, 9, 10, 11 and 12 are greatly enlarged elevation views, partly in section, of typical semiconductor devices embodying the present invention.

Referring to FIGS. 1, 2 and 3, the invention is shown as embodied in a thyristor which is extremely rugged and which has particularly effective electrical and thermal properties to allow improved high power operation. As seen most clearly in FIG. 3, the device includes a generally cylindrical die 10 of silicon having upper and lower regions 12 and 14 of P-type material and an intermediate region 16 of N-type material, these regions extending out to the peripheral edge of die 10 and defining first and second PN junctions. A planar region 18 of N-type material is formed in region 12 to define a planar junction which terminates in a closed configuration at surface 11 of die 10. The planar junction lies beneath an oxide annulus 20 formed on surface 11 over the edge of the planar junction and over the adjoining surface regions to provide junction passivation. The junctions are preferably of relatively large area to aid in the improved device performance, as will be explained hereinafter.

The semiconductor die 10 with the large area junctions formed therein is intimately bonded to a thermally massive axially configured stud terminal structure. A cylindrical stud terminal 22 of an electrically and thermally conductive material such as molybdenum has a circular area substantially coextensive with the area of surface 13 of die 10 and is bonded to this surface to provide intimate contact therewith. A collar terminal 24, typically molybdenum, is dimensioned to be bonded to the region of face 11 outside the periphery of oxide annulus 20. The outside diameter of terminal 24 is substantially the same as the diameter of stud terminal 22. The annular area of terminal 24 is substantially coextensive with the area of surface 11 outside of annulus 20, and terminal 24 is fused to this area with its outer cylindrical surface being substantially colinear with cylindrical terminal 22. A third cylindrical stud terminal 26, also typically molybdenum, is dimensioned to fit within and be substantially coextensive with the circular region within annulus 20, and is bonded to this semiconductor region coaxially within collar 24.

It will be appreciated that the device terminals are substantially coextensive with the large area semiconductor surfaces with which they are associated, and, therefore, provide large area contact advantageous for efficient thermal operation. An annulus 28 of glass or other suitable electrically insulative and thermally conductive material is fused within the annular space formed between terminals 24 and 26 into intimate contact with the confronting surfaces of these terminals and to the associated surface of semiconductor 10 and oxide annulus 20. It is significant that sealing is accomplished without junction contamination since oxide annulus 20 provided on surface 11 of the die protects the junction from spurious impurities. Glass ring 28 serves to further rigidly bond the terminal structure to the semiconductor die and to further enhance the highly conductive thermal path from the semiconductor die to the terminal structure. An outer sleeve 30 of glass or other suitable material is formed around the periphery of terminals 22 and 24 and is fused thereto and to the periphery of semiconductor die 10, thereby to protect the exposed peripheral edges of the junctions formed in die 10, as well as furnishing a rugged mechanical and thermal package.

The silicon wafer is metallurgically bonded to the relatively massive stud terminals to provide a unitary axial structure which is mechanically rugged as well as being thermally and electrically efficient. The exposed circumferential edges of the semiconductor junctions formed in die 10 are protected by the sleeve of glass 30 which is fused around the periphery of this die and the adjacent portions of terminals 22, 24 and 26, the silicon die 10, and the glass sleeves 28 and 30, are intimately bonded into a solid mechanical structure which is extremely rugged and which provides a highly conductive thermal path axially of the device. Heat generated within the semiconductor junctions is, therefore, conducted via this efficient stud terminal construction axially away from the junctions for dissipation to the surrounding environment in which the device is operating.

The device is fabricated by bonding the terminals to respective faces of the silicon die by means of a bonding layer fusing at about 900° C., placing the glass annulus 28, which has a coefficient of thermal expansion substantially matching that of the die and the terminals, between terminals 24 and 26 and in contact with the confronting surface of die 10, and heating the assembly to a temperature above softening to fuse it into intimate contact with the terminals, die 10 and oxide annulus 20. The peripheral edge of die 10 is etched to remove any contaminants which may be present and this edge and the adjacent portions of terminals 22 and 24 are enclosed within glass having a coefficient of thermal expansion substantially matching that of the die and the terminals. The assembly is again heated to a temperature above the softening point of the glass until the glass has fused into driect contact with the die and the terminals. Most conveniently, the bonding of the glass to the terminals is accomplished by enclosing the circumferential edge of the die and the adjoining portions of the terminals in a tubular sleeve of glass and heating the sleeve to a temperature above softening until it has fused into intimate sealed relation with circumferential edge of the semiconductor die and with the terminals.

Electrical connection is made to the device by means of cylindrical leads 32 and 34 which are mechanically and electrically connected to respective terminals 22 and 26, and by a tab lead 36 connected to collar terminal 24 and extending radially therefrom. Leads 32 and 34 are bonded to their respective terminals by means of brazing rings 38 and 40, which typically are preformed on the respective ends of the stud terminals, the assembly being heated to a temperature suitable to effect an intimate bond between the leads and their associated terminals. Tab lead 36 is formed with a circular opening 37 (FIG. 8) on one end thereof dimensioned to fit over one end of collar 24. A brazing ring 42 also fits over collar 24 in contact with lead 36 or can be preformed on tab 36. The assembly is heated in a furnace at a temperature sufficient to cause the brazing material to flow, thereby effecting a good mechanical and electrical bond between the terminals and their respective leads. As seen in FIGS. 1 and 2, brazing ring 42 is shown after it has been heated and it is seen that its melting and subsequent fusion has formed a fillet between the circumferential surface of collar terminal 24 and the adjoining surface of lead 36. Similarly, brazing members 38 and 40 have formed a contoured transitional surface between the respective terminals and their associated leads. Tab lead 36 may have an opening 44 provided in the distal end thereof, as illustrated, for ease of connection to an associated circuit.

Figure 13:
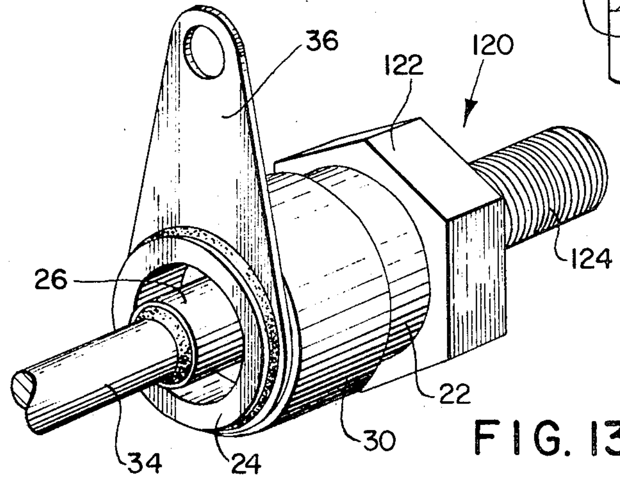
FIG. 13 is a pictorial view of the invention having an alternative lead configuration.

An alternative lead configuration is illustrated in FIG. 13 which depicts the device having a threaded stud connection which permits facile mounting on a suitable heat sink. The stud connector 120 has a head portion 122 and a threaded stud 124 depending therefrom, the head typically being of greater area than that of terminal 22. The circular face of terminal 22 is mounted on the confronting surface of head 122 and is bonded thereto to provide an intimate electrical and thermal contact.

The tab lead 36 in this embodiment is somewhat larger than the tab lead of FIG. 1 to provide sufficient clearance of the head 122 when interconnecting the device in circuit. In certain instances, it is desirable to provide an electrically isolated stud mounting wherein the device is thermally connected via the stud connector to a heat sink but electrically isolated from the stud connector. Such an isolated stud mounting may also be employed with devices of the present invention, a particularly effective mounting being described in detail in a copending application entitled High Power Semiconductor Diode, Ser.

No. 726,399, filed May 3, 1968, assigned to the assignee of the present invention.

As a major feature of the invention, electrical connection is made to the gate electrode of the thyristor by means of relatively massive lead 36 and collar terminal 24. The large area contact between the gate electrode and the lead structure bonded thereto provides an extremely effective thermal dissipation path from the semiconductor die to the ambient. Thus, heat generated within the junction, caused, for example, by high current through the gate lead of the device, is efficiently removed from the junction without affecting the electrical performance of the device. The construction of the device according to the principles of the invention is such that even excessive currents flowing through the gate electrode, such as caused by transient conditions in the circuit with which the device is employed, may be safely carried by the device since heat generated by these excessive currents can be removed by the thermally efficient terminal construction before damage to the junction can result.

Figure 4:
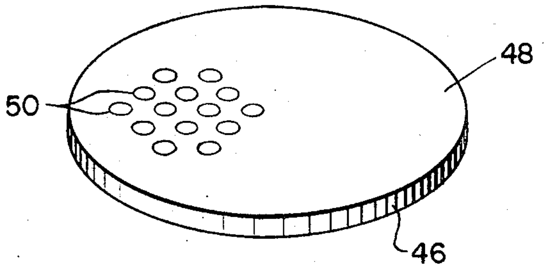
FIGS. 4, 5 and 6 are greatly enlarged pictorial views of a semiconductor slice illustrating the process of fabrication of semiconductor dice of the type useful in the present invention.
Figure 5:
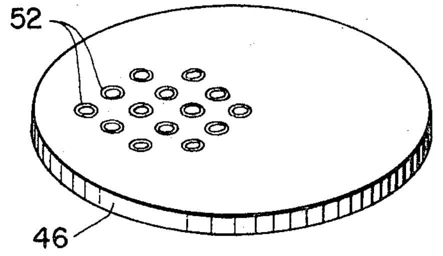
Figure 6:
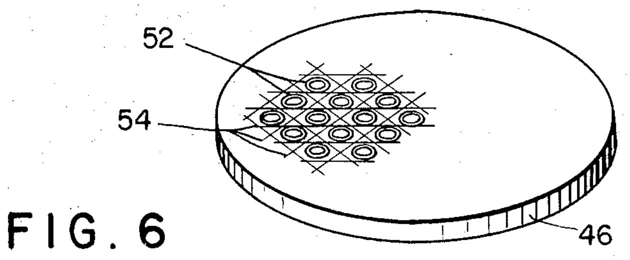

The silicon die 10 is formed by well known diffusion and masking techniques, a typical fabrication process being described in conjunction with FIGS. 4 through 6. A plurality of dice is formed from a single slice. A silicon slice 46 of N-type conductivity is chemically polished by well known techniques to provide surfaces for the accurate and controllable diffusion of dopants therein. Boron is diffused into both circular surfaces of slice 46 at a temperature and in a time sufficient to achieve predetermined junction depths. First and second PN junctions are thus provided within the body of slice 46. An oxide coating 48 is formed on a surface of slice 46 and a plurality of openings 50 are formed in this oxide surface by well known photoresist and chemical etching techniques to provide a properly masked surface for planar diffusion. Phosphorous is next diffused into the semiconductor wafer via openings 50 to form a N-type region beneath each opening, this N-type region defining a PN junction with the P region in which it is diffused. The N-type region, being formed by the planar process, diffuses into the P-type region and under the oxide coating defining openings 50. Thus, the planar junction terminates beneath the oxide surface and is thereby passivated by the oxide layer which prevents contamination from the environment. As illustrated in FIG. 5, the oxide coating is removed except for oxide annuli 52 disposed over the planar junctions formed in the slice. As discussed hereinabove, annuli 52 are employed to protect the planar junctions which terminate at the semiconductor surface and also serve to define the junction regions to which the device terminals are to be bonded. The surface of the slice containing annuli 52 is next metallized and selectively etched to expose the oxide annuli. The slice 46 is then scribed, for example, by means of a diamond scribing tool, along the lines 54 indicated in FIG. 6, and the slice then broken along these lines to provide individual semiconductor bodies. As illustrated, slice 46 is scribed by a plurality of horizontal lines and by a plurality of diagonal lines to define a hexagonal shape around each annulus 52. Such scribing is generally along the crystal axes of the slice to facilitate separation thereof. The hexagonal shape is advantageous in that it provides greater bulk than the more conventional square die configuration and, therefore, is thermally more efficient. In addition, the hexagonal shape minimizes the volume to be sealed and the radial distance through which the glass must travel to effect the seal. Moreover, thinner walled collars can be employed, which permits flexibility in the size of the inner terminal which can be utilized to suit particular device requirements.

Figures 7, 8:
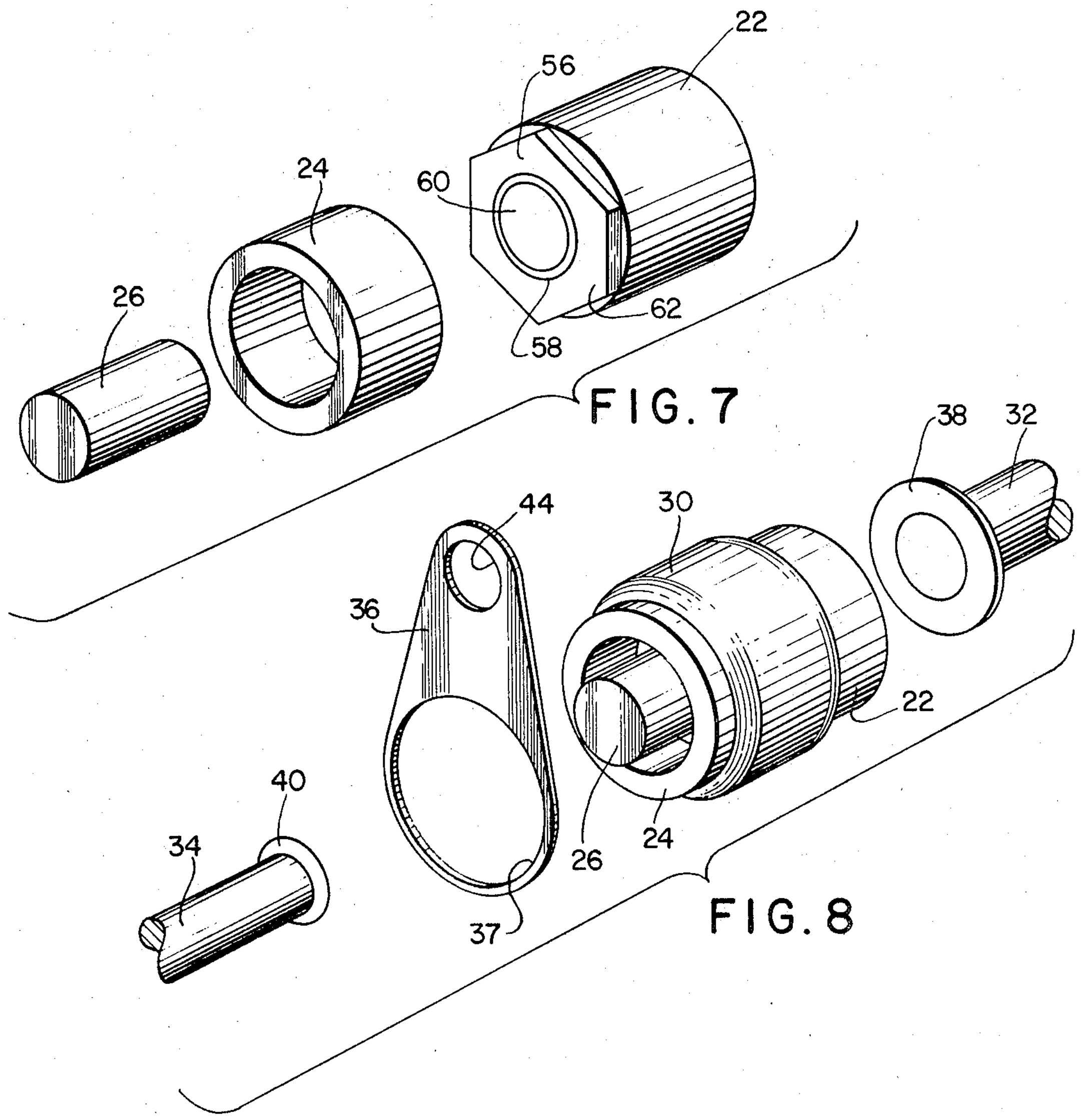
FIG. 7 is an exploded pictorial view of a stud terminal structure according to the present invention.
FIG. 8 is an exploded pictorial view of device leads employed in the invention.

An individual hexagonally configured die having the junctions shown in FIG. 3 formed therein is illustrated in greatly exaggerated form in FIG. 7. Die 56 is mounted on and intimately bonded to a circular surface of cylindrical stud terminal 22. The major dimension of die 56 is substantially the same as the diameter of stud terminal 22, so that the die is contained completely within the circular area of this terminal. Oxide annulus 58 is formed over the planar junction formed in the visible surface of die 56 and also defines a circular N-type region 60 and peripheral P-type region 62. Collar terminal 24 has an inside diameter dimensioned to substantially register with the outside diameter of annulus 58, and an outside diameter substantially the same as the outside diameter of stud terminal 22. Thus, when terminal 24 is assembled and fused to die 56, a large area contact is made to P-type region 62, and terminals 22 and 24 define a colinear cylindrical structure which is adapted for effective mechanical and thermal encapsulation according to the invention. Stud terminal 26 has a diameter substantially the same as or slightly less than the inside diameter of annulus 58 and is assembled coaxially within collar 24 and bonded to N-type region 60 to effect large area contact with this region.

After the terminals are assembled with the semiconductor body, the protective glass sleeves are fused to the terminals to complete the device structure. As described hereinabove, a glass ring is fitted in the annular region between terminals 24 and 26 and fused to the confronting surfaces of the terminals and to the associated surface of die 56 and oxide annulus 58. A sleeve of glass 30 is placed around the outer surface of terminals 22 and 24 and is fused thereto and to the peripheral surfaces of die 56 as described hereinabove.

The connection of device leads to the semiconductor structure is illustrated in FIG. 8. Leads 32 and 34, having preformed braze members 38 and 40 respectively formed thereon, are connected to respective terminals 22 and 26 by placing the braze members on the respective circular terminal surfaces and then suitably heating the assembly to form a braze bond. Tab lead 36 has an opening 37 formed in the larger end thereof dimensioned to fit over collar 24 in contact with the annular edge of glass sleeve 30, and the tab is brazed to terminal 24 by means of a braze ring to form an intimate electrical and thermal contact therewith, as well as a strong mechanical connection.

The invention has been described thus far with respect to a thyristor having a single planar junction, as illustrated in FIG. 3; however, the invention is broadly useful with a variety of three and four terminal semiconductor devices. By way of example, several typical devices with which the invention is useful will now be described in conjunction with FIGS. 9 through 12.

FIG. 9 shows a thyristor in which all the junctions are of planar form and which all terminate at a single surface of the semiconductor body. This construction is advantageous in that all junctions are passivated and need not be etched prior to sealing. Regions of P-type material 72 and 76 are formed in N-type body 70, and a second N-type region 74 is formed in P-type region 72, all the junctions defined by these regions terminating at the upper surface of the device. An inner annulus 78 of oxide is provided on the upper surface over the junction between regions 72 and 74, and an outer oxide annulus 80 is provided over the other two junctions of the device. As before, the oxide annuli provide junction passivation and permit the improved terminal structure according to the invention. A metallized ring 82 is formed over oxide annulus 80 and in contact with the exposed surface of region 72. This metallized ring, which may be formed of one or more metal layers by well known deposition techniques, provides electrical connection to P-type region 72. Collar terminal 24 is bonded to metallized ring 82, as illustrated, to provide gate connection to the device, while stud terminals 22 and 26 are bonded respectively to region 76 and region 74 as described hereinabove to provide the anode and collector device connections.

Figure 10:
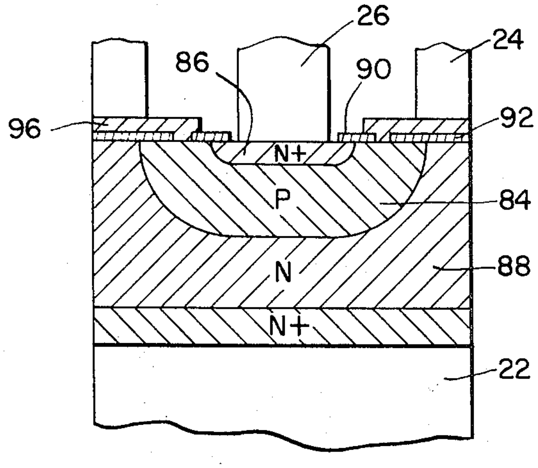

FIG. 10 shows a planar transistor similar in construction to the thyristor of FIG. 9, which includes a P-type region 84 and an N-type region 86 formed in N-type body 88, the planar junctions between these regions again terminating at the upper surface of the device. The lower portion of region 88 adjacent stud terminal 22 is more heavily doped to provide improved terminal connection in the well known manner. Oxide annuli 90 and 92 are provided over the respective junctions, annulus 92 extending from its junction to the periphery of the device. A metallized ring 94 is formed over annulus 92 and in contact with region 84 to provide electrical connection thereto. Collar 24 is bonded to metallized ring 94 to provide a base connection, stud terminal 26 is bonded to region 86 within the confines of oxide annulus 90 to provide emitter connection, and stud terminal 22 is connected to the lower surface of region 88 as the collector terminal.

Figure 11:
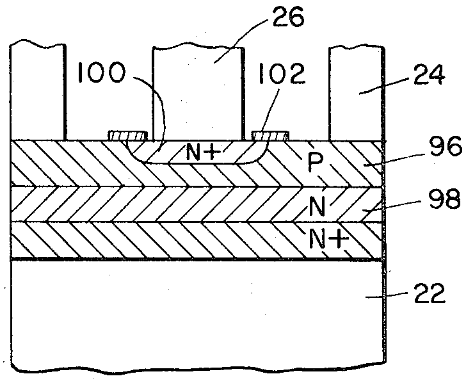

Another transistor structure is illustrated in FIG. 11 in which the emitter-base junction is of planar configuration, while the base-collector junction is of mesa construction. A base-collector junction is formed between P-type region 96 and N-type region 98, while the emitter-base junction is formed by planar diffusion of an N-region 100 into region 96. An oxide annulus 102 is formed over the planar junction in accordance with the principles of this invention. Emitter contact is made by stud terminal 26 bonded to the exposed surface of region 100 within oxide annulus 102, base connection is made to region 96 by collar 24, and collector connection is made by stud terminal 22 connected to the more highly doped portion of region 98.

Figure 12:
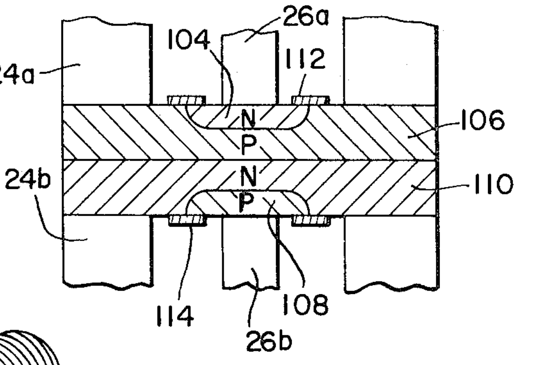

A four-terminal thyristor is illustrated in FIG. 12 having one mesa junction and two planar junctions terminating at respective opposite surfaces of the device. One planar junction is formed by diffusing an N-type region 104 into a P-type region 106 and by diffusing a P-type region 108 into N-type region 110. Oxide annuli 112 and 114 are formed over the exposed edges of the respective planar junctions in accordance with the invention. A first collar terminal **24*a* is bonded to a surface of region 106 to provide a positive gate terminal, and a second collar terminal 24*b* is connected to region 110 to provide a negative gate connection. Stud terminal 26*a* is connected to the surface of region 104 within oxide annulus 112 to provide a collector connection while an anode connection is provided by stud terminal 26*b* bonded to the surface of region 108 within oxide annulus 114**.

It will be appreciated that each of the devices described hereinabove are sealed with inner and outer glass rings as in the embodiment of FIG. 2 to provide a completed device structure, and that electrical leads can be connected to the terminal structure in the manner described hereinabove.

From the foregoing it is evident that extremely rugged semiconductor devices have been provided which are especially suitable for high power application. The devices provide an extremely effective axial thermal dissipation path from the semiconductor body to the working environment to permit high power device operation without danger of breakdown due to thermal damage. Terminal connection is made to the junctions of the semiconductor body by large area thermally massive contact, thus incidental or intentional high currents flowing through these junctions are not deleterious to device operation.

Various modifications and alternative implementations will occur to those versed in the art. For example, the planar junctions and the overlying oxide annuli need not be circular, as in the illustrated embodiments, but can be of any closed configuration, such as an oval or a star pattern, to provide intended device characteristics. Moreover, the particular materials employed in the terminal and sealing structure can vary with specific performance requirements, as can the lead configuration. Accordingly, it is not intended to limit the invention by what has been particularly shown and described, except as indicated in the appended claims.

What is claimed is:

1. A semiconductor device comprising:

a generally cylindrical semiconductor body having first and second spaced-apart faces and a peripheral portion therebetween, two or more PN junctions formed in said body, at least one junction being a planar junction having an edge terminating at said first face in a closed configuration;

an oxide pattern of closed configuration formed on said first face over the edge of said at least one planar junction and over portions of said first face adjacent said junction;

a first electrically and thermally conductive stud terminal having an end intimately bonded to said second face, said stud terminal extending axially from said body;

a second electrically and thermally conductive stud terminal having an end area substantially coextensive with an intimately bonded to the area of said first face within said at least one oxide pattern, said second stud terminal extending axially from said body;

an electrically and thermally conductive collar terminal disposed coaxially around said second stud terminal and having an end area substantially coextensive with and in intimate electrical and thermal contact with the area of said first face outside of said at least one oxide pattern;

an electrically insulative thermally conductive material disposed between said second stud terminal and said collar terminal and bonded to the confronting surfaces thereof and to said at least one oxide pattern and the adjacent surfaces of said first face; and a sleeve of electrically insulative thermally conductive material disposed around said first stud terminal and said collar terminal and bonded thereto and to the peripheral portion of said body.

2. A semiconductor device according to claim 1 wherein said first stud terminal and said tubular stud terminal have substantially the same diameter and are arranged colinearly with each other.

3. A semiconductor device according to claim 1 wherein said electrically insulative thermally conductive material is glass having thermal expansion characteristics compatible with those of said stud terminals and said semiconductor body.

4. A semiconductor device according to claim 1 further including first and second leads respectively attached to said first and second stud terminals and disposed axially therewith, and a tab lead attached to said collar terminal and disposed radially therefrom.

5. A semiconductor device according to claim 4 wherein said tab lead has an opening in one end thereof configured to fit around one end of said collar terminal, said tab lead being conductively attached to said collar terminal.

6. A semiconductor device according to claim 4 wherein said first lead is a stud connector having a head portion attached to said first lead and a threaded stud depending from said head.

7. A semiconductor device according to claim 3 wherein said terminals are molybdenum.

8. A semiconductor device according to claim 1 wherein said semiconductor body has two PN junctions formed therein terminating at said peripheral portion.

9. A semiconductor device according to claim 3 wherein said semiconductor body is hexagonal and lies within the end area of said first stud terminal.

10. A semiconductor device according to claim 1 wherein:

said semiconductor body has two planar junctions formed therein, each terminating at said first face in generally concentric relationship, said at least one junction being the inner of the two junctions;

a second oxide pattern of closed configuration formed around the periphery of said first face over the edge of said outer planar junction; and an electrically conductive member of closed configuration formed over said second oxide pattern and in intimate electrical and thermal contact with the area of said first face intermediate said oxide patterns, said collar terminal being in intimate contact with said conductive member.

11. A semiconductor device according to claim 1 wherein:

said semiconductor body has three planar junctions formed therein, each terminating at said first face in generally concentric relationship, said at least one junction being the innermost of the three junctions;

a second oxide pattern of closed configuration formed around the periphery of said first face over the edges of the outer two of said three junctions; and an electrically conductive member of closed configuration formed over said second oxide pattern and in intimate electrical and thermal contact with the area of said first face intermediate said oxide patterns, said collar terminal being in intimate contact with said conductive member.

12. A semiconductor device according to claim 1 wherein:

said semiconductor body has first and second planar junctions formed therein, each terminating at a respective first and second face;

a second oxide pattern of closed configuration formed on said second face over the edge of said second planar junction and over portions of said second face adjacent said second junction;

said first stud terminal having an end area substantially coextensive with and intimately bonded to the area of said second oxide pattern; and a second electrically and thermally conductive collar terminal disposed coaxially around said first stud terminal and having an end area substantially coextensive with and in intimate electrical and the thermal contact with the area of said second face outside of said second oxide pattern.

13. A semiconductor device according to claim 1 wherein each oxide pattern is of annular configuration.

References Cited

UNITED STATES PATENTS

| | | | |
|---|---|---|---|
| 3,200,310 | 8/1965 | Carman | 317—234 |
| 3,392,312 | 7/1968 | Carman | 317—234 |
| 3,261,075 | 7/1966 | Carman | 317—234X |

JOHN W. HUCKERT, Primary Examiner

R. F. POLISSACK, Assistant Examiner

U.S. Cl. X.R.

317—235